United States Patent [19]
Gillis et al.

[11] Patent Number: 6,058,496
[45] Date of Patent: May 2, 2000

[54] SELF-TIMED AC CIO WRAP METHOD AND APPARATUS

[75] Inventors: Pamela Sue Gillis, Jericho, Vt.; Kevin William McCauley, Greene, N.Y.; Ronald J. Prilik, Chesterfield, Va.; Donald Lawrence Wheater, Hinesburg; Francis Woytowich, Jr., Charlotte, both of Vt.

[73] Assignee: International Business Machines Corporation, Armonk, N.Y.

[21] Appl. No.: 08/955,442

[22] Filed: Oct. 21, 1997

[51] Int. Cl.[7] .................................................. G01R 31/28
[52] U.S. Cl. ........................................ 714/727; 324/765
[58] Field of Search .................................. 714/724, 726, 714/727, 729, 731, 733, 734; 324/763, 765

[56] References Cited

U.S. PATENT DOCUMENTS

| | | | |
|---|---|---|---|
| 3,896,378 | 7/1975 | Bedford | 324/188 |
| 4,878,209 | 10/1989 | Bassett et al. | 368/113 |
| 4,912,709 | 3/1990 | Teske et al. | 714/724 |
| 4,939,389 | 7/1990 | Cox et al. | 307/443 |
| 5,122,978 | 6/1992 | Merrill | 364/569 |
| 5,206,861 | 4/1993 | Hannon et al. | 714/726 |
| 5,226,048 | 7/1993 | Bandali et al. | 714/724 |
| 5,260,946 | 11/1993 | Nunally | 714/724 |
| 5,315,242 | 5/1994 | Enami | 324/158 R |
| 5,457,400 | 10/1995 | Ahmad et al. | 324/763 |
| 5,473,618 | 12/1995 | Takeshita et al. | 714/733 |
| 5,530,706 | 6/1996 | Josephson et al. | 714/726 |
| 5,544,173 | 8/1996 | Meltzer | 714/726 |

FOREIGN PATENT DOCUMENTS

| | | |
|---|---|---|
| 62-021080 | 1/1987 | Japan . |
| 4-242180 | 8/1992 | Japan . |
| 6-088862 | 3/1994 | Japan . |

OTHER PUBLICATIONS

Boundary–Scan Design Principles for Efficient LSSD ASIC Testing, Bassett et al., IBM J Res. Develop. vol. 34 No. 2/3 Mar/May '90 pp. 339–354.

"Internal Access Time Measurements for Random–Access Memory Circuits," *IBM Technical Disclosure Bulletin*, vol. 31, No. 7, pp. 296–298, Dec. 1988.

"Clock Chopper On–Chip Delay and Pulse–Width Measurement Technique," *IBM Technical Disclosure Bulletin*, vol. 32, No. 8A, pp. 136–139, Jan. 1990.

"Latched I/O AC Test Using A Reduced Pin Boundary Scan Logic Test Method," *IBM Technical Disclosure Bulletin*, vol. 34, No. 4A, pp. 230–232, Sep. 1991.

*Primary Examiner*—Trinh L. Tu
*Attorney, Agent, or Firm*—James M. Leas

[57] ABSTRACT

A method and apparatus for testing a semiconductor chip includes providing the semiconductor chip with a common input/output (I/O) or bidirectional I/O pad. The I/O pad is electrically coupled to an off-chip driver (OCD) and an off-chip receiver (OCR). The OCD, I/O pad, and OCR are combined in a common input/output (CIO) or bidirectional I/O configuration. The I/O pad is effectively open circuited by an external tester and a performance parameter of the IO circuits connected to the open circuited pad is tested.

20 Claims, 2 Drawing Sheets

SELF-TIMED AC CIO WRAP METHOD AND APPARATUS

BACKGROUND OF THE INVENTION

1. Field of the Invention

This invention relates generally to a method and apparatus for testing semiconductor chip devices and, more particularly, to AC time delay fault testing (AC path delay) of high speed semiconductor chip common input/output (I/O), also known as bidirectional I/O (BIDI).

2. Discussion of the Related Art

In the testing of semiconductor chip devices, such as application specific integrated circuit (ASIC) and/or microprocessors with high speed I/O's, time intervals for particular semiconductor chip functions, such as access, setup, and hold times, are desired to be measured. With current known semiconductor chip testing technology, time intervals are measured by a tester external to the semiconductor chip, wherein the tester provides appropriate testing signals and measures corresponding response times for a particular tested function. The particular semiconductor chip device is then characterized and classified based upon the measured response time. Furthermore, in view of very small time intervals, on the order of less than one nanosecond (<1 ns), and higher semiconductor device operating speeds or rates, on the order of greater than 200 MHZ, testing of semiconductor chip devices is becoming increasingly difficult to do with a high degree of accuracy.

Testing of input/output ports (I/O's) of semiconductor chips has historically been performed with a physical tester/DUT (device under test) interface and an appropriate set of test signal patterns, waveforms, and timings created by a tester in accordance with a particular semiconductor device or chip testing procedure. As semiconductor device speeds increase, however, the accuracy of the present known types of measurements greatly diminish due to the dynamics of the interface between the tester and the device under test. Mismatched transmission lines, poor or no terminations on signal line leads, cross talk between adjacent signal lines, noise, inductance of particular fixturing of the tester/DUT interface, high pin (or pad) counts, high delta I's (i.e., changes in power line currents per unit time), and many other causes contribute to making the tester/DUT interface and fixturing errors a prominent portion of any measurement done in the greater than approximately 250 MHZ range. In other words, testing integrity of the tester/DUT interface and fixturing, for measurements done in the greater than 250 MHZ range, suffer adversely due to undesirable affects involved in the dynamics of the interface between the tester and the DUT during a testing procedure.

Errors in measurements include tester driver skew, tester measurement error, and fixturing errors, incurred when an output impedance $Z_{out}$ of the DUT driver has an impedance of anything but that of the tester, typically 50 ohms. This could be as large as multiples of a round trip fixture time (typically on the order of 2.5 ns (nanoseconds)) when there are large impedance mismatches (on the order of greater than fifty percent (>50%)) between the DUT driver impedance and the tester fixturing impedance, further wherein the test signal cannot be terminated at the tester end. Tester driver skew refers to a deviation from a true value or ideal tester driver signal. Typical tester driver skew is on the order of 125–300 ps (picoseconds).

In one instance, I/O's of a semiconductor chip designed to drive low picofarad (i.e., on the order of 2 to 5 pf) wirebond or daughtercard traces to static random access memory (SRAM) devices are in fact loaded with 50 ohm AC (alternating current) loads to ground (i.e., ground potential). Such loading to AC ground due to the characteristics of transmission lines, which may occur, for example, for a period of time on the order of 3 to 5 ns (corresponding to a round trip time for the tester fixturing), severely degrades the actual performance of the semiconductor chip I/O's drivers. As a result of the degraded testing performance, the device under test may end up being characterized as a slower part, when in reality, it is a faster part. In other words, the faster part ended up being mis-classified as a slower part due to testing errors. Furthermore, it is not desirable for faster parts to be mis-binned as slower parts.

I/O mismatch is a large factor in an error budget for semiconductor chip testing. Typical tester measurement error in on the order of 225–425 Ps. Furthermore, mismatch error is a function of the actual DUT impedance, which further varies from chip to chip, driver to driver. As a result, undesired nanosecond errors can be easily created using test apparatus known in the art.

Testing of large complex logic circuits by scan test methodologies includes the use of test patterns or vectors being shifted into shift register latches, such as disclosed in U.S. Pat. No. 5,544,173, assigned to the assignee of the present invention and incorporated herein by reference. The shift register latches are typically components of functional registers in the logic circuit. Testing of large complex circuits to detect AC or delay faults includes shifting into a particular shift register latch a pattern of a logic "0" followed by a logic "1" or vice versa in such a manner as to cause a transition of the observable output of a logic circuit under test. For example, one scan test methodology, such as Level Sensitive Scan Design (LSSD), has been extended to the testing for AC delay faults. AC delay faults correspond to those circuit faults wherein the circuits behave correctly according to the static logical equations expected, however, the circuits do not assume these values in the correct time but take longer than expected to assume the correct value. Using scan techniques to detect AC delay faults requires a time sequence of first and second test vectors. The first test vector sensitizes the logic path to be tested. The second test vector provides the appropriate plurality of logical "0" to "1" and "1" to "0" transitions from the first test vector to cause an observable logical output to switch. This output can be captured into a shift-register latch with an appropriate clock. If the correct value is captured, it is seen that the sensitized path switched with no more delay than the time between the presentation of the second test vector and the capture clock.

In prior known methods of doing an AC performance test of an output I/O, a test set-up would include a tester having a driver, driver fixturing to the device under test, receiver fixturing from the device under test, and a tester receiver. To test an output I/O would include launching a transition from the tester driver, go through fixturing, go through a DUT receiver, go through chip logic, whether it be a clock fan out logic or other mechanism, and induce the DUT driver to make a transition. Once the DUT driver has been induced with the transition, the induced transition then has to travel across the fixturing and be captured by the tester receiver. In the known method, both the launching mechanism and its associated clock, and the receiving mechanism and its associated clock are in the tester. There are two problems associated in that situation, one being larger than the other. The fixturing error is essentially a mismatch in impedance between the device under test driver and the tester fixturing. Generally, the tester fixture impedance is fixed, thus, depending upon how large the mismatch is, there is ringing and overshoot which may predominate in the AC delay fault measurement of the DUT driver, which disadvantageously causes errors in the measurement. In the presence of such errors, it is possible to characterize (based upon faulty testing by the tester) a very low impedance, fast chip slow. For various reasons, it's not always, or seldom possible to accurately match the output impedance of the device driver under test and the tester. There exists sufficient variation in process technology that if you intended to match impedances, the impedances would not match to within five or ten percent (i.e., where process technology refers to the particular technology used in the manufacture of the particular chip, such as, 0.25 $\mu$m technology).

It would thus be desirable to provide a method and apparatus for providing an optimal testing of AC fault delays of very complex semiconductor device logic circuits which does not suffer from the problems as discussed herein above.

SUMMARY OF THE INVENTION

It is an object of the present invention to provide a method and apparatus for measuring a propagation delay of a positive or negative transition between two points on a semiconductor chip.

The present invention provides a method and apparatus for measuring a propagation delay with reference to an absolute value or as against preset limits.

The present invention further provides a method and apparatus for measuring a propagation delay of a common input/output (I/O) on-chip driver/on-chip receiver (OCD/OCR) pair through a chip I/O pad without use of an external tester contact to the chip I/O pad.

Measurement of the AC fault delay according to the present invention is accomplished either by I) controlling a launch event independently via a launch clock and sensing the result at the sense point via a sense clock; or ii) sensing the results at both points of a transition created by some other synchronous means, for example, corresponding to a launch clock and a sense clock.

The present invention still further provides a means to generate and accurately calibrate two clocks for use in facilitating an AC delay fault measurement, including, for example, on-chip calibrating of a launch clock and a sense clock.

Yet still further, the present invention provides a means for searching for an absolute value of a propagation delay in any of the above described measurements.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

In accordance with the present invention, the problem of tester measurement errors in AC delay fault testing as discussed herein above is advantageously solved by eliminating tester device fixturing which disadvantageously causes test measurement error. A desired AC delay fault testing measurement is made by the semiconductor chip itself without any test fixturing attached to the particular I/O thereof being tested. The I/O to be tested is fabricated with both an on-chip driver (OCD) and an on-chip receiver (OCR) connected to the particular I/O. A logic path to a latch for the driver and a separate logic path to a latch for the receiver is fabricated on-chip. Both positive and negative transitions are launched from the driver latch, through the driver, through the receiver and then captured in the receiver latch. The timing of the latch launch and capture can be created by off-chip clocks or can be derived from a common clock tree and "adjusted" via programmable delay lines on-chip, to be further discussed herein below.

In accordance with the present invention, a programmed delay value, which is changed according to a particular test measurement, can be accurately calibrated by on-chip frequency change methods as follows. A delay line is first programmed to its minimum delay and then put into a logic loop to create a self oscillation. The resulting frequency is then measured by comparing the number of cycles counted in the self oscillator with a time window created by counting the common chip clock for a specified number of counts with a counter. The delay line is then programmed to a delay value and the resulting new frequency is measured by the same method. The programming of the delay line is then the difference in period between the first programmed delay value and the second programmed delay value (i.e., wherein period (T) equals one over the frequency, T=1/freq.). The programmed delay line value can be compared to a desired value, wherein the delay line value can then be incremented or decremented in response to the comparison. Furthermore, the process is repeated until a desired value is calibrated in the delay line. The accuracy of the calibration is a function I) of how many bits there are in the counters for the time window and the frequency counter and ii) of the accuracy of the common clock. With this calibration method, errors of less than one percent (1%) can be easily achieved.

Figure 1:
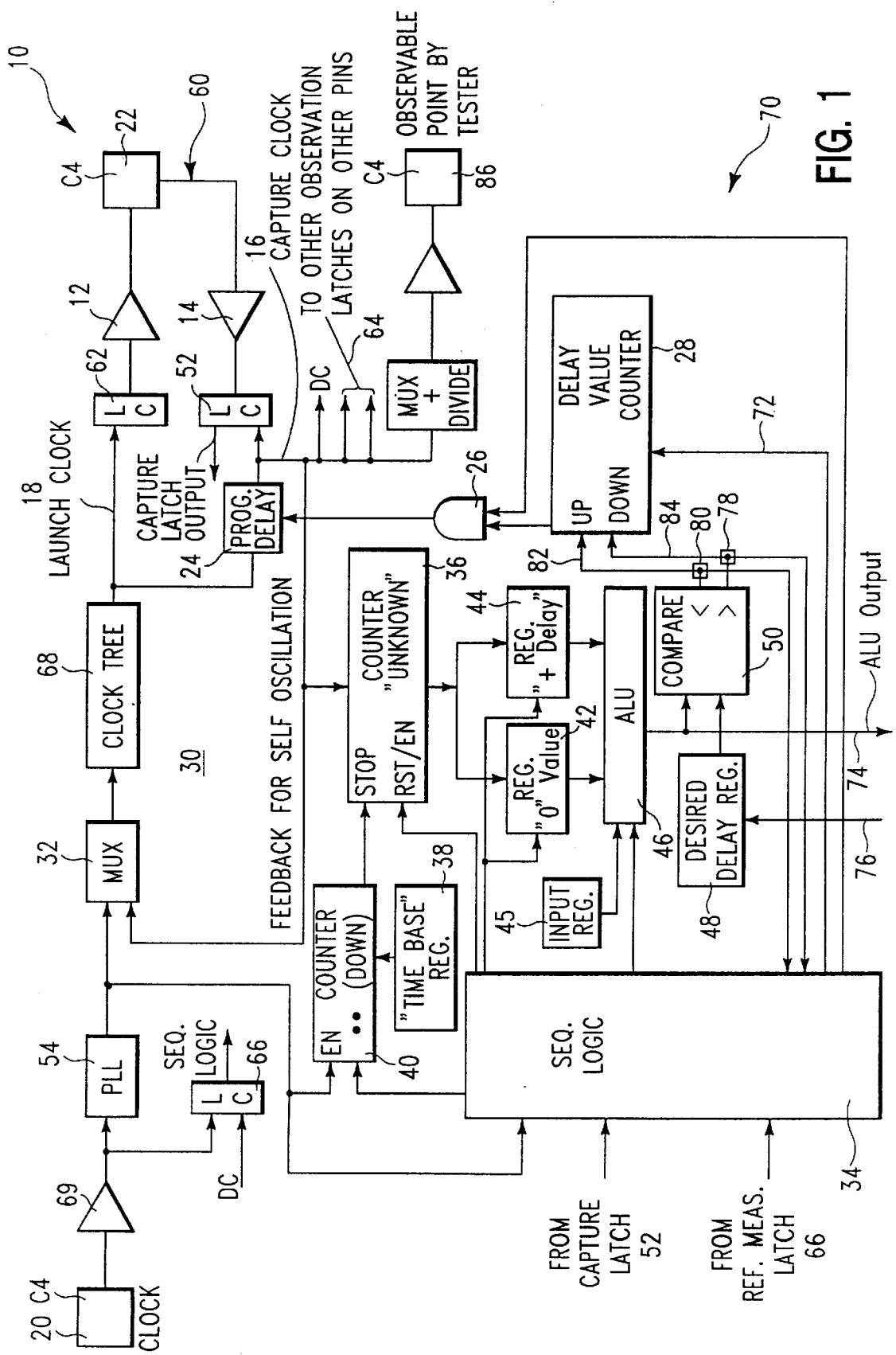
FIG. 1 illustrates an embodiment according to the present invention having a self-calibrating time base with CIO wrap measurement features for on-board setup and hold measurements.

Turning now to FIG. 1, an implementation and operation of the present invention according to a first embodiment shall be discussed. FIG. 1 illustrates an integrated circuit chip 10, and more particularly, a logic circuit chip including means for implementing a self calibrating method for measuring a time interval between a launching event and a capturing event. The logic circuit 10 is also applicable for measuring a time interval between two or more capturing events. In the example to be discussed herein below, it is assumed that all events on the chip are driven synchronously from a clock source on input 20 and that the frequency of this source is known.

Measurements of a launch/capture nature, for example, with respect to an AC performance of a driver/receiver pair (12,14), consist of delaying a capture clock 16 with respect to a launch clock 18 by a known amount. The delay of the capture clock 16 with respect to the launch clock 18 can be a single value delay for a "go-no go" type of fault testing. Alternatively, the delay of the capture clock 16 with respect to the launch clock 18 can be interactively modified for making an exact (analog) measurement (i.e., of the amount of delay).

By extension, a go-no go differential time measurement of two or more capturing events, for example, an access or setup time measurement from an input 20 to an output 22 can be done by making two launch/capture measurements and then obtaining a difference between the two measurements. The time position of the launch event is immaterial as long as it is the same for both measurements.

Similarly, an analog measurement can be made via iterative go-no go measurements. In order to accomplish the this, a delaying element with sufficient resolution needs to be calibrated against a known accurate reference (in this example, corresponding to the input clock frequency 20) which allows the construction of the variable delay element to be relatively lax. Calibration of the difference between two delay settings to a known value may be accomplished on the chip 10 in the following manner.

a.) Set the programmable delay 24 to an initial value (such as, zero in the launch/capture example) either by gate 26 or by loading delay value counter 28 by scan or other suitable means.

b.) Enable the delay loop 30 for self oscillation via multiplexer (MUX) 32, for example, by use of a Macleod loop, as is known in the art.

c.) The sequence logic 34 then enables the counter 36 to count the number of cycles of the free running self oscillating loop 30 for a period of time determined by the value in the time base register 38 via counter 40. The time base value in register 38 is set to be very much larger than the expected loop period, where setting of the register is accomplished by scan preload or other suitable means. The time base value in register 38 is exactly known since it is a multiple of the known input clock period at clock input 20.

d.) The value contained in counter 36 after step (c.) is indicative of the frequency of oscillation of the loop 30 and is then placed in the "0"-value (zero value) register 42.

e.) In a similar manner, the sequence logic 34 repeats step (c.) loading the new value obtained into delay register 44 where it can be mathematically combined in arithmetic logic unit (ALU) 46 with the original value in register 42. The result of ALU 46 is then compared with contents of a desired delay register 48 value using comparator 50, the delay register 48 having been preloaded via scan or other suitable means. The delay value is then either increased or decreased via delay counter 28 and step (c.) repeated with a new value put into the delay register 44 until the sequencer logic 34 determines that the value of the programmed delay is equal to the desired delay to within a desired accuracy and within the resolution of the programmable delay 24.

The above steps (a.)–(e.) constitutes what would be necessary to perform a calibration for a go-no go delay measurement. The same steps could also be done iteratively for an actual time analog measurement. Suitable logic modifications could be added to the sequencer 34 to cause it to increment the programmable delay 24 until the occurrence of a particular change in the observation latch 52, wherein a value output by the substract element 46 would correspond to the measured time value.

The values in the registers are related by the following equations for the implementation described herein above.

Tb=Time base register 38
Dd=Desired delay register 48
C=an appropriately chosen constant (Register 45)
Vo=Value obtained in "0" value register 42
Vd=Value obtained in "delay" register 44
PLL=Frequency multiplication factor of PLL 54, if used
Pc=Period of the input clock at 20

$$Dd=((C/Vd)-(C/Vo))=((C*PLL)/(Pc*Tb))*(\text{Desired delay})$$

where * signifies a multiplying operation.

The values of Tb and C should be chosen such that Vo and Vd are reasonably large but do not exceed the capacity of counter 36 and registers 42 and 44.

Referring still to FIG. 1, a launch clock signal line 18 and capture clock signal line 16 are indicated. Testing for the AC path delay of the common I/O or bidirectional I/O 60 will be discussed further herein below. The terms "common I/O" (CIO) and "bidirectional I/O" (BIDI) are used interchangeably herein. As shown, the common I/O or bidirectional I/O cell 60 includes a launch latch 62, driver 12, C4 pad 22, receiver 14, and capture latch 52. The launch clock 18 and capture clock 16 are derived from a system clock at input 20 of the chip. The individual latches on the driver side and receiver side of the common I/O or bidirectional I/O 60 may be part of the system logic or they could be just simply observing the system logic. Other observation latches could be included in the chip as desired for a particular application as indicated by reference numeral 64. For example, an observation latch 66 is provided for observing the input clock 20, also referred to as a reference measurement latch 66. The reference measurement latch 66 is clocked, indicated by the reference DC, from the same source as that of the observation latch 52 for the receiver portion of the common I/O or bidirectional I/O 60. Alternatively, any other input could be observed in a similar manner for the purposes of a differential time measurement.

The clock signal from programmable delay latch 24 is used for driving both the clock on the capture latch 52 and on the reference measurement latch 66. The latches are thus clocked by the programmable delay 24.

A launch clock and a capture clock (including capture clocks at different times) can be generated for the purpose of making an observation at a particular latch or different observations at different latches. As shown in the FIG. 1, a loop 30 is created from the programmable delay 24 back to the MUX 32 and down through clock tree 68. The clock tree 68 inverts its input to create a phase shift where needed. The clock tree 68 is arbitrary, and doesn't necessarily have to be included, however, for an oscillation to occur, it is necessary to have a 180° phase shift device included within the loop 30. A clock tree is simply the fanout of a clock to many latches, that is, providing the same clock pulse to a number of devices.

A system clock is provided on the clock input C4 pad 20. A driver 69 connects the C4 pad clock input 20 to a phase-locked loop PLL block 54. The PLL block 54 is an optional block which may be used to multiply the clock or to divide the clock. The output of the PLL block 54 is some multiple of the input system clock 20. The output of the PLL block 54 is input into a first input of MUX 32. MUX 32 is used for switching between the input clock signal and a clock signal generated by the programmable delay 24. The output of the MUX 32 is input into the clock tree 68. In the absence of the clock tree, a 180 degree phase shift device is included in the net around the loop 30 so that an oscillation occurs in the loop. In this embodiment, the net around the loop 30 includes the programmable delay 24, the MUX 32, and back around to the input of the programmable delay 24.

Discussing now a launch/capture example, one object is to produce a known time which is a calibratable time between the launch clock 18 and the capture clock 16. In one embodiment, the programmable delay 24 is to be programmed to this known time. For the go/no go test method, the known time corresponds to the one time value that is the value used for the go/no go determination. In the go/no go determination, a comparison is made whether or not a transition was captured in the observation latch 52 after an expiration of the particular programmed delay 24. Thus, as illustrated in FIG. 1, a means 70 for accurately determining what the programmable delay is set at is provided, as further discussed herein below. The programmable delay 24 is programmed according to prescribed signals on digital input lines (illustrated as a single line).

In a preferred embodiment, the programmable delay 24 is set to an initial value, for example zero (0). MUX 32 is adjusted appropriately for producing an oscillation in the feedback loop 30. The frequency of the oscillation is then determined and its period saved for example, in register 42. The programmable delay 24 is set to a new value, wherein an oscillation is produced. The new frequency and period are determined. The difference in the two settings of the programmable delay 24 corresponds to the difference between the two periods, that is, the period of oscillation at the first setting and the period of oscillation at the second setting. The time difference between the two settings may further correspond to the time difference between a launch and a capture event.

Determining the frequency of oscillation can be accomplished in one of several ways. For example, the frequency of the loop could be determined by shipping the oscillation signal off the chip and observing it by an external tester. The tester could then determine the frequency of the oscillation signal, via suitable means. Next, data could be scanned into the chip to change the programmable delay to a new value, allow it to oscillate at the new value, then observe the new oscillation by the tester and have the tester determine the frequency of the new oscillation signal. From the two frequencies, corresponding periods are determined. Subtracting the two periods provides an indication of what the programmable delay 24 is set to.

During a differential time testing between the launch and capture points in the chip 10, in the simplistic case, the programmable delay 24 is first set to zero (0). Setting the programmable delay 24 to zero means that there is no delay between the launch and capture events. Next, the programmable delay 24 is set to a second value, and the frequency and period for the second delay value are determined. The two periods are then subtracted to determine what delay time the programmable delay 24 is set at. Next, a determination is made as to whether or not the delay value is bigger than or smaller than what is desired. If bigger, then the delay is made smaller. If smaller, then the delay is made bigger. In essence, a hunt and successive approximation technique is used until the programmable delay 24 is set to the desired value. Once the programmable delay 24 is calibrated to the desired value, the process of launching and capturing an event can be performed. The system clock 20 is used for launching a transition, via the PLL 54, MUX 32, and the clock tree 68, without an oscillation in the loop 30. The transition event is then captured in the capture latch 52, using the calibrated delay of the programmable delay 24 for the capture clock.

In a go/no go test, for example, let's say a launch is executed at zero nanoseconds and a capture is executed at 1.5 nanoseconds. Provided the transition is captured in the capture latch 52 at 1.5 nanoseconds after the launch, then the particular I/O passed. In this example, the programmable delay 24 is set for 1.5 nanoseconds. Since delay elements are typically inaccurately calibrated or unknown due to manufacturing process variation, and so on, the present invention utilizes a self-oscillation, finding of two frequencies, and subtracting their periods for determining an actual delay. When a particular delay value is desired, which is 1.5 nanoseconds in the present example, an iterative process is used, as discussed, for calibrating the delay to the desired value. A launch and capture test can then be performed using the calibrated delay value for the capture clock.

In the determination of an actual time between events, for example of an AC CIO delay fault wrap test, the process starts with a series of launch events and bumping up or incrementing the programmable delay 24 forward for each launch event until the transition is just captured. The series of launch events could be continuous or could include discreet separate events. The delay of the programmable timer 24 is incremented each time until the point at which the correct transition is captured in the capture latch 52. In other words, a transition is launched at launch latch 62 and the capture latch 52 is monitored. After each launch/capture, the delay is incremented. Once the transition is captured in the capture latch 52, the setting of the programmable delay 24 is noted or saved. The programmable delay 24 is then zeroed or nulled. In this instance, the launch event corresponds to the zero setting of the delay, i.e., the clock of latch 62. The frequency and period are determined at both settings. The two periods are subtracted and the result is an actual delay time from when the event was launched by latch 62 and when the event was captured in the capture latch 52. In essence, during an actual delay measurement, the delay is first zeroed and then incremented until a capture of a transition occurs. Alternatively, the process could be started using a longer delay time than required and then iterating the delay times downward until the transition is no longer captured, wherein the programmable delay setting to save would correspond to the last setting in the series of downward iterations at which the transition was captured. The method described herein may thus be viewed as a differential time measurement method of the propagation of an event between two points on a chip. An external tester is thus not included in a path between a launch event from a launch latch and a capture event at a capture latch. In the case of the AC CIO wrap delay fault, nothing other than the driver output 12 and the receiver input 14 is connected to the common I/O C4 pad 22.

The elements at the bottom of FIG. 1 include a means 70 for measuring frequency, i.e., two frequencies, determining the respective periods, subtracting the periods, and comparing the difference of the periods with a prescribed value, for use in accordance with the present invention. Counter 40 is initially loaded with a value from register 38, the value corresponding to a particular time window, or time base. Counter 40 is counting the occurrences of the input clock 20, or its modification as by the PLL 54 previously mentioned, that produce a particular known time window. Counter 40 enables counter 36 to count the number of occurrences of the unknown oscillation frequency of the self oscillation loop 30 previously discussed. Counter 40 is controlling the amount of time that counter 36 is allowed to count transitions of the unknown frequency. Counter 36 is started by the sequencing logic 34, at the same time that the sequencing logic 34 starts counter 40 counting down. When counter 40 finishes its count, a signal is sent to counter 36 to stop counter 36.

Sequencing logic 34 is coupled to ALU 46. ALU 46 receives an input value from an input register 45, the input register 45 for holding a constant value. In essence, a value is generated in counter 36 corresponding to one of the unknown frequencies. The value generated by counter 36 is placed into either register 42 or register 44 depending on whether it is the lower frequency or the higher frequency. The higher frequency would be placed in the 0-value register 42 and the lower frequency would be placed in the delayed value register 44, as controlled by sequencing logic 34.

The first determination, typically, includes beginning with the programmable delay 24 set at 0. With the programmable delay 24 set at 0, the higher frequency value is produced. Similarly, with the programmable delay 24 set to a value other than 0, a lower frequency value is produced. The sequencing logic 34 sends control signals to the registers regarding when they can be loaded with information from counter 36. That is, the sequencing logic 34 sends a signal out to register 42 for loading of the high frequency value. The sequencing logic 34 then sends out a signal to register 44 to indicate when to load register 44 with the lower frequency value. The ALU 46 then takes the frequency values and performs an inversion on each, i.e., corresponding to a mathematical function of one over the frequency value number. In the later instance, using the frequency values directly would result in very small fractions, thus a large constant over the frequency value numbers produces a higher digital value as provided by register 45. A floating point ALU could be used also in place of the ALU, and thus be able to handle the very small numbers. In any case, the values in registers 42 and 44 are inverted and then subtracted from one another. The result of the subtraction is a digital representation of a period. The period is output on the ALU output signal line 74. The ALU output 74 is input into a first input of a comparator 50. A second input to the comparator 50 is from a desired delay register 48. The desired delay register 48 receives a desired delay value or values either from a scan load mechanism from outside of the chip or other logic could provide a desired delay value or values via input 76. The comparator 50 received the two inputs and compares the two inputs with respect to one another. If the measured period is different from the desired period, either it is too small or it is too big. The comparator 50 outputs either a greater than signal 78 or a less than signal 80 for adjusting the programmable delay 24 accordingly through delay value counter 28. The comparator 50 outputs are fed back to the sequencing logic 34 wherein the sequencing logic is responsive to the outputs for controlling operation of the delay value counter 28 and the programmable delay 24. Alternatively, the comparator 50 may have an equal output, wherein the equal output can be fed back to the sequencing logic 34 for stopping the sequencing logic from further adjustments to the programmable delay via delay value counter 28.

Sequencing logic 34 sends a signal to delay value counter 28 for the case of finding an actual analog value of delay. In finding an actual value of delay, sequencing logic 34 causes the delay value counter 28 to start incrementing the delay of the programmable delay 24, beginning from a shortest delay. Feedback is provided, from an appropriate observation latch such as latch 52, back to the sequencing logic 34. When the incremented delay equals that of the capture time of a transition, then the sequencing logic 34 sends out a signal to cause the delay counter 28 to stop. In this instance, the delay counter 28 is not responsive to the up and down inputs. Sequencing logic 34 is coupled to delay value counter 28 via suitable control lines 72.

In the go/no go mode, delay value counter 28 is responsive to the up and down inputs 82 and 84, respectively. In the mode where the actual delay value is sought, however, the delay value counter 28 is responsive to an input from the sequencing logic 34 for finding an actual value of the delay for which a transition event is captured. In the latter instance, an appropriate feedback mechanism would be used between the contents of the observation latch 52 and the sequencing logic 34. For example, the feedback mechanism could include shifting of the capture latch output through to the sequencing logic, for the sequencing logic to evaluate if the expected transition occurred. As shown in FIG. 1, the observation latch for the event capture includes an output, further wherein the observation capture latch output is input into sequencing logic 34.

When searching for an actual delay time, the frequency compare method, as discussed herein above, is used i) to compare two frequencies, and then ii) find out the differences in frequencies between a present value of the delay and some arbitrary 0 (zero) value, or some other point on the chip that a differential time measurement with respect thereto is desired. The difference in the frequencies is readily observed at the ALU output 74, which could be routed as appropriate to another register or latch. The sequencing logic 34 can be modified as needed for sequencing the operation of the above.

The delay value counter 28 is coupled to the programmable delay 24 via a logic gate 26. The logic gate 26 provides a mechanism for being able to set the programmable delay 24 to a 0 value. Alternatively, the programmable delay 24 could be set to a 0 value using the sequencing logic 34 and loading of the delay value register, i.e., delay value counter 28, to 0. Thus, there are several ways of nulling the programmable delay 24.

The reference measurement latch 66 in the upper left hand corner of FIG. 1 is typical of that used for the purpose of measuring a set up time or a hold time, which may include a measure from an input event to an output event. For example, if it is desired to measure from the clock input 20 to the driver 12 output, then the programmable delay 24 is set up to run delay values, from say 0 to a maximum value, or from 0 to a point where a transition edge is just captured in the reference measurement latch 66. The output of the reference measurement latch 66 is then investigated using the sequencing logic 34. That is, a frequency measurement, similarly as discussed above, is made and stored, for example, in register 42. Next, the same thing is done with respect to capturing of an event in the observation latch 52 of receiver 14, which is connected to the output of driver 12 and the C4 pad 22. Using a similar sequence, the delay time for just capturing the event is found, the corresponding frequency is determined, and its value inserted into register 44. The frequencies are input into the ALU 46, wherein the ALU 46 determines a difference in time between the two events, i.e., from the input to the output. In the latter instance, the timing of an event from the input to the output corresponds to a propagation delay time. In a similar manner in accordance with the present invention, a propagation delay between two arbitrary points on a chip may be determined. In a preferred embodiment, LSSD latches are used for the observation latches and are thus functional latches, thereby minimizing the requirement for extra nonfunctional latches. The LSSD latches are actually used in the function of the integrated circuit chip for their respective intended purposes, thus referred to as functional latches.

In accordance with the present invention, the AC CIO wrap delay fault testing includes measuring a time differential through an I/O using a wrap mechanism. With the present invention, no tester connections are established on the common I/O output C4 pad 20. Thus, errors previously attributed to the tester are advantageously eliminated. The wrap delay fault testing can also be used for launch/capture time interval measurements either from the periphery of the chip to another point on the periphery of the chip or some internal chip location(s). Still further, the wrap delay fault testing can also be used for launch/capture time interval measurements from an internal chip location to the periphery of the chip.

The present invention further includes a mechanism for creating and calibrating two clocks which launch and capture an event. Alternatively, the creating and calibrating mechanism can be used for the first capture event and the second capture event in the instance of doing an observation from one point to another on the chip. Each of the clocks can be accurately calibrated or the difference between them can be accurately determined.

In accordance with the present invention, no external tester connections are present upon the particular I/O being tested. However, it may be that an external tester is providing clocking signals to the chip in a location of the chip other than at the common I/O of interest. The present invention thus removes the time sensitive portion of the test measurement from that of the tester being performed directly on-chip. In the AC CIO wrap test according to the present invention, the actual common I/O being tested and the time sensitive nature thereof is kept separate from the tester. The tester may however be connected to the chip for obtaining non-time sensitive latched information.

In accordance with the present invention, the time which is actually being monitored is the time that it takes for a transition to be launched from the launch latch 62, to then travel through the driver 12, the C4 pad 20, back to the receiver 14 and then for the transition to be sensed at the capture latch 52. In other words, the measurement time is the time delay from the launching latch to the capturing latch.

With the present method, the driver may be a very fast driver, followed by a very slow receiver, however the particular device may pass the go/no go test because it is the sum of the transition times through the driver and the receiver that is measured. Any extra capacitance in the common I/O or bidirectional I/O path would manifest itself by the entire transition time of the path being slowed down. In other words, when the transition time path is slower than expected, then the driver could be slow, an intolerable capacitance could be on the C4 pad, or its cause could be due to other factors. The test measurement can thus be used to provide an indication that there exists a need to examine the particulars of the common I/O or bidirectional I/O in closer detail using some other mechanism, such as using physical failure analysis, to determine more specifically the cause of the timing delay problem.

Advantages of implementing the generation of launch and capture clocks on chip for conducting AC delay fault testing include the following. Timing on-chip eliminates tester errors, including tester fixturing errors, and allows an infinite migration path to future technologies. Calibration for timing can be done to the most error free external reference, corresponding to a continuously running clock. Systematic jitter effects of tester synthesized frequencies are eliminated by averaging a "large" number of clock cycles utilizing a PLL with a long settling time constant, thereby essentially obtaining the tester crystal oscillator accuracy at any synthesized frequency. In addition, timing accuracy is solely dependent on the number of bits in the delay and "time base" counters and the skew of the on-chip wiring delays to the observation latches. Lastly, either structural (ac defect) CIO wrap measurements or current performance I/O measurements, such as, setup and hold (with observation latches on appropriate pins) are permitted.

The self-timed AC CIO wrap method and apparatus according to the present invention thus correspond to the following. In one embodiment, the method and apparatus include a self-timed element in that a timing for launch and capture clocks is generated on-chip. The AC aspect of the present invention deals with transitions from a low to a high state, or a high state to a low state. CIO refers to a common input/output or bidirectional I/O. The CIO is a function of the design of the particular semiconductor chip for which the present invention applies. That is, the design of the semiconductor chip includes a driver and a receiver on a single chip I/O whether or not a particular application requires it. The present invention, as it relates to the AC CIO wrap testing, only applies to common or bidirectional I/O. In accordance with the present invention, wrap refers to the sending of a signal out on the driver and receiving the signal back on the receiver of that I/O. Note that a C4 pad (i.e., a point of external chip connection) is connected between the driver and the receiver of the common or bidirectional I/O.

The present invention thus provides improved testing for AC delay faults on a particular I/O cell of a semiconductor chip. The method of AC CIO wrap testing of a single I/O cell can apply to the testing of all of the CIO's of the semiconductor chip. This testing can be done sequentially or in parallel.

An alternative for the calibration of the delay would be to perform the frequency measurements by an external means (e.g., by a tester) via an external pad or probe point 86 on the integrated circuit chip. Appropriate conditioning could be done via scan control or other suitable means.

Alternatively, according to another embodiment of the present invention, the launch and capture clocks for the self-timing may also be generated off-chip, such as, utilizing external clocks supplied from a tester. In the alternate embodiment, the semiconductor chip being tested includes inputs for the launch clock and the capture clock which are generated from an external source (i.e., tester) as described further herein below with respect to FIG. 2.

Figure 2:
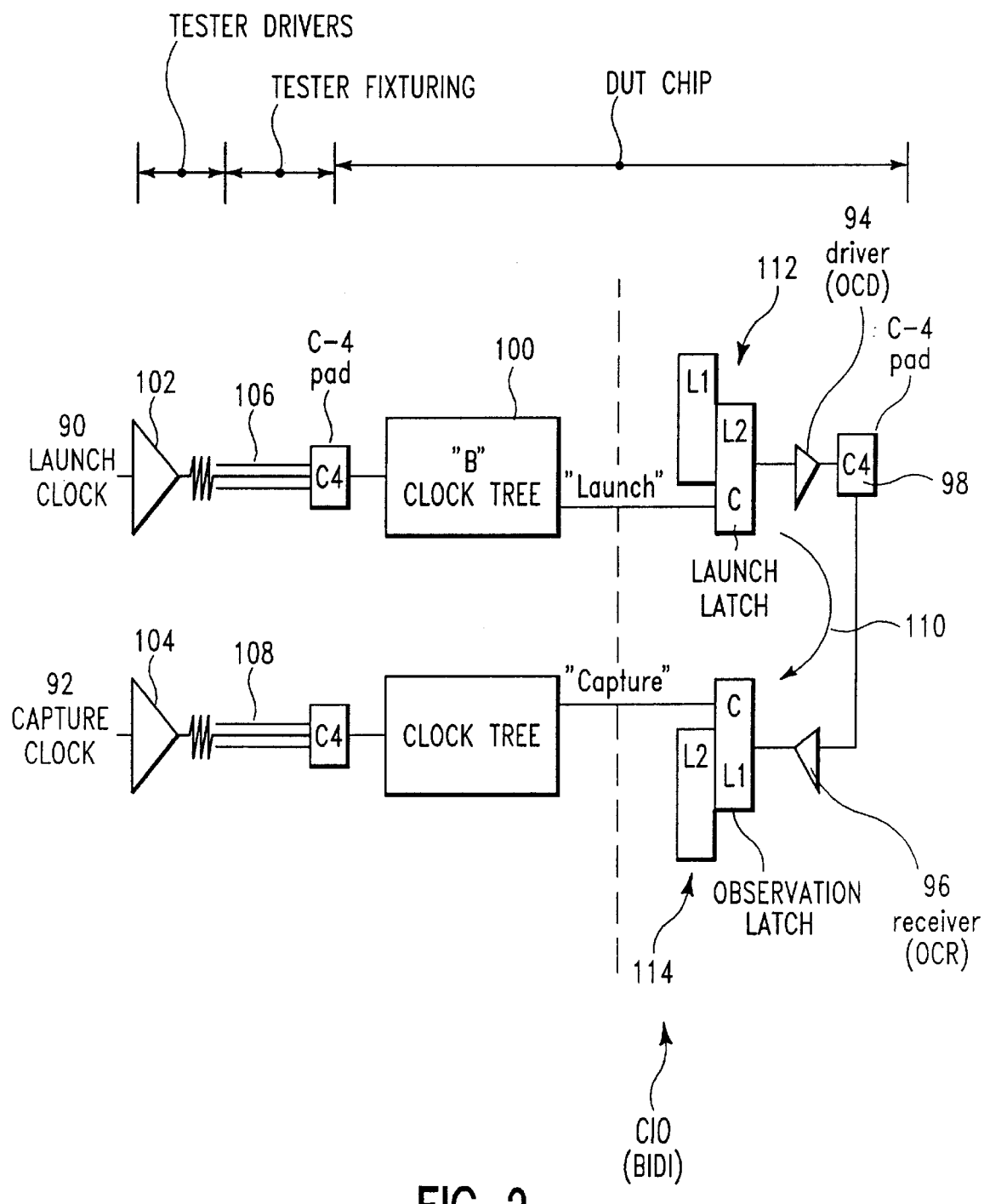
FIG. 2 illustrates an alternate embodiment according to the present invention utilizing launch and capture clocks sourced from an external tester.

In FIG. 2, the launch clock and capture clock are being generated by an external tester. In this case, the fixturing is preferably accurately matched with the output impedance of the tester. The tester is not connected up to the output C4 pad of the CIO being tested. Clocktrees are shown in the figure to indicate that there can be a fanout of clocks. The clocks from the clocktrees may go to multiple latches on the chip other that those shown. With LSSD, according to a particular implementation of scan, as shown, one clocktree feeds the Li latches and a different clocktree feeds L2 latches. Other implementations of the clocktrees are possible. In addition, master/slave latches are shown for the driver (launch) latch 112 and the receiver (capture) latch 114, however, other suitable latch arrangements can be used also.

With reference still to FIG. 2, in accordance with an alternate method according to the present invention, external tester generated launch 90 and capture 92 clocks are used in the AC CIO Wrap delay fault testing. AC CIO Wrap using LSSD (Level Sensitive Scan Delay) clocks requires a common IO (CIO) or bidirectional (BIDI) driver 94 and receiver 96 on an output/input pin 98 or pad. Launches or triggers of a "rising" or "falling" edge are caused to be propagated through the I/O to check for AC delay defects in I/O. An "error" in the measurement is characterized by tester driver skew (2×) (due to one edge of the launch clock and one edge of the capture clock) plus the error in the on-chip clock tree 100 fanout. Using the tester for generating the launch clock 90 as discussed eliminates testing errors due to a mismatch at the DUT output into the tester due to variabilities in DUT output impedances. As previously discussed, the variabilities in DUT output impedances can be as large as 2×(two times) the transmission line length. In addition, generation of the launch clock as discussed eliminates a minimum pulse width specification of a tester receiver. Still further, input errors are minimized because tester impedances are fixed at Z0 of a transmission line, which also eliminates minimum pulse width problems because of a dual clock.

In the alternate embodiment of the present invention, two tester channels of a tester (not shown) with associated drivers 102, 104 and fixturing 106, 108 are used for creating a launch event clock 90 and a capture event clock 92, however, the delay fault observation occurs on-chip with no external connection to the common I/O pad 98 of the on-chip driver 94 being tested. In FIG. 2, the upper tester driver 102 is the launch driver and the lower tester driver 104 is the capture driver. The tester (not shown) is creating two clocks for the timed events that determine whether or not a transition (high to low or low to high) made it around the common I/O or bidirectional I/O loop 110 in an appropriate amount of time. The C4 pad 98 of the common I/O or bidirectional I/O loop 110 being tested has no external connections thereto during AC CIO wrap testing. The upper set of master/slave latches 112 deal with the driver portion of the common I/O or bidirectional I/O 110 and the bottom pair of master/slave latches 114 deals with the receiver portion of the common I/O or bidirectional I/O 110. In this embodiment, timing for the launch and capture clocks is provided by the external tester. As shown in the drawing figure, the C4 pads indicate physical chip boundaries. On the left hand side of FIG. 2 is the boundary where the tester clocks enter the chip. Likewise, on the right hand side of FIG. 2 is the boundary of the C4 pad of the common I/O or bidirectional I/O being tested. There may be many CIO C4 pads 98 on a single chip, wherein only one is shown for simplicity. During an AC CIO wrap testing of the common I/O or bidirectional I/O circuits 94, 96, and pad 98, data is set up in the L1 and L2 latches 112 and 114, as appropriate, such that when the launch and capture clocks are pulsed, an appropriate state change occurs in order to launch a transition and in order to observe it, respectively. The state change corresponds to a change from a low level to a high level or a high level to a low level.

With reference still to FIG. 2, capture clock timing is adjusted in the following manner. If determining an exact amount of time taken for a transition to go through the driver 94, through the C4 pad 98, and back through the receiver 96, then the capture clock may be moved incrementally closer and closer to the launch timing until the appropriate transition is not sensed as expected. For example, if a logical "1" is launched, then after the transition should have occurred, a "1" should be detected on the capture latch, hence as expected. If a "0" is in the capture latch, then the transition either had not yet arrived or was never going to arrive, hence unexpected and incorrect.

In other words, the method starts out with an incrementing of the capture clock 92 at a larger time than a time it takes for the transition to get from the driver to the receiver. Beginning with an occurrence of the launch clock, the time period of when the capture clock is executed is initialized with a long period of time between the launch and capture events, and then the time period is shortened incrementally, keeping track of the capturing of the event in the capture latch 114, until the transition is no longer captured in the capture latch 114. At the point where the transition is no longer captured in the capture latch 114, then the last period of time to capture the transition in the capture latch is determined to be the transition time or time of flight of the transition between the driver and the receiver of the common I/O or bidirectional I/O. Thus the measurement of interest can be obtained using an iterative method for obtaining an actual measurement value. This iterative method is used for a characterization mode of testing of the semiconductor chip device. In a go/no go method of testing of a semiconductor chip device, the launch and capture clocks are set to occur at a specified or simulated maximum time for a transition (launch to capture) to propagate to an expected logic state (value). In the later instance, the go/no go test provides a good/no good or pass/fail identification for a particular device under test.

Loading (i.e., initializing the transition) of the driver latch 112 is accomplished using a scan chain or other suitable mechanism, in a manner known in the art. For example, a scan chain could scan through the L1–L2 pieces of the latches, wherein the scan chain could be controlled by the tester. The tester would set up the states of the L1–L2 latches appropriately and then apply the launch clock and capture clock. The tester would then scan out the contents of the observation latch and evaluate the result. In evaluating the result, no critical timing or urgency is required since the tester is merely examining the latch contents via scan or other method and sensing what has been detected. The observation latch may be read by the tester through a scan chain or other suitable method. The method of reading the observation latch is not time dependent. By implementing the time measurement of the transition in the above described manner, errors due to the fixturing, impedance mismatching, etc. are advantageously eliminated. No external contact is made to the common I/O or bidirectional I/O C4 pad during a transition time measurement of the AC CIO delay fault testing of the common I/O or bidirectional I/O. Thus, no adverse loading effects occur on the common or bidirectional I/O C4 pad since there is no external connection made thereto during a transition time measurement of the AC CIO wrap test. The performance of the testing is improved in the absence of the external contact to the common or bidirectional I/O C4 pad.

As an alternate embodiment of the present invention, a transition event may be continuously launched by the system clock on the chip. Two observation latches could be used, one as a launch observation latch and the other as a capture observation latch. In this alternate embodiment, the two observation latches would look at what is happening just prior to an associated driver. In this mode, the system clock timing remains unaltered. The difference in this alternate embodiment is that instead of the launch clock creating an event in the system path, the launch clock would in fact clock an observation latch which is testing a particular path. This alternate embodiment includes constant launching and then hunting using the launch observation latch for its transitions. The same hunt would occur on the receiver latch. One hunt would be to find the initial transition and find out where it was, and the other hunt would be to find the other transition and find out where it was. The difference between the two events corresponds to a propagation delay between the launch observation latch and the capture observation latch. In other words, an observation latch is used for detecting what got launched at a particular time. The observation latch can be clocked by a separate distinct launch clock, the launch clock for enabling the observation latch. In short, an observation latch is going to evaluate a driver latch, or launch latch, that is being continuously clocked by the system clock. The capture observation latch, using similar reasoning, is going to then capture, or examine what gets captured, by either that same observation latch or a different latch that's going to be enabled by a capture clock, which is the system clock.

In a further extension of the above discussion, at an event can be observed at a C4 pad, and by extension, any point in the chip, and further be observed as a launch event. A desired point of the chip, either on the periphery of the chip or internal to it, is then observed as the capture event. For example, an observation latch could be on an input C4 pad and an observation latch could be on an output C4. An access time measurement or a setup and hold measurement could be carried out as discussed herein above. In short, an observation is made as to when did a transition go by this particular input C4 pad, and then going over to the output C4 pad, observing when did the transition go by on this output C4 pad. The difference between the two observation times corresponds to the access time measurement of interest. In this later instance, separate observation latches on different C4 pads can be used for measurement of differential time measurements within an integrated circuit on a chip.

The present invention includes the use of an observation latch on a common I/O or bidirectional I/O. The observation latch can be used for doing the launching and capturing where there is a continuous launch. That is, the system clock feeds the launching event from the driver latch. The system clock may also clock an observation latch of the receiver side of the common I/O. That is, a separate observation latch is provided on the receiver side in which the timing of that observation latch has a launch and also a capture so as to evaluate what is being launched and what is being captured.

The present invention advantageously provides a unique logic for controlling the I/O's of a high speed semiconductor device, further for performing a desired testing thereon.

The present invention thus eliminates the major source of error in the current measurement of a semiconductor chip device during a high speed I/O testing operation. The present invention is also extendable into the future indefinitely, as it improves along with improvements with technology.

While the method and apparatus for AC CIO Wrap delay fault testing according to the invention has been shown and described herein above, it is to be understood that variations thereof can equally be carried out using other suitable known techniques. For example, calibration of the delay can be accomplished by time domain techniques. Also, frequency measurements may be done off chip with suitable feedback of results to the sequencing logic. Still further, the PLL (phase locked loop) which has been discussed herein above for multiplying or dividing frequencies, may or may not be required for a particular integrated circuit application, the discussion thereof intended only as an example. Circuits other than PLL can also be used if frequency multiplication or division is needed.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention as limited solely by the appended claims.

What is claimed is:

1. A method of testing a semiconductor chip comprising the steps of:
    (a) providing the semiconductor chip with a common input/output configuration comprising an IO pad electrically coupled to an off-chip driver and to an off-chip receiver; and
    (b) performing a characterization test upon the common input/output configuration while leaving the off-chip driver and off-chip receiver disconnected from a load that is off the chip that can degrade accuracy of testing.

2. The method of claim 1, wherein the IO pad is not electrically contacted by a contractor of an external tester.

3. The method of claim 1, wherein the off-chip driver includes data and enable lines controlled by latches.

4. The method of claim 3, wherein the latches include boundary scan latches.

5. The method of claim 1, wherein the off-chip receiver includes an output connected to a latch.

6. The method of claim 5, wherein the latch includes a boundary scan latch.

7. The method of claim 1, further comprising the steps of:
    providing a first device for launching a transition; and
    providing a second device for capturing the transition.

8. The method of claim 7, wherein said performing step (c) comprises performing a differential time interval measurement for measuring a performance parameter of the chip.

9. The method of claim 7, wherein the first device includes a latch.

10. The method of claim 9, wherein the latch is clock controlled.

11. The method of claim 7, wherein the second device is a latch, the latch including a data input and a clock input.

12. The method of claim 11, wherein the second device further includes a boundary scan receiver.

13. The method of claim 1, further including the steps of:
    (a) providing at least two devices for sensing a transition; and
    (b) sensing the transition on the at least two devices.

14. The method of claim 13, wherein the at least two devices includes latches.

15. The method of claim 14, wherein the latches are clock controlled.

16. The method of claim 13, wherein at least two devices include latches, the latches each including a data input and a clock input.

17. The method of claim 16, wherein the at least two devices further include boundary scan receivers.

18. The method of claim 13, wherein the at least two devices are provided for sensing a transition at locations internal to the chip.

19. The method of claim 13, wherein one of the at least two devices is provided for sensing a transition at a location internal to the chip and the other of the at least two devices is provided for sensing a transition at the IO pad.

20. A method of testing a semiconductor chip comprising the steps of:
    (a) providing the chip having a pad and I/O circuits connected to said pad, said I/O circuits comprising an off-chip driver and to an off-chip receiver;
    (b) testing a performance parameter of said I/O circuits connected to said pad while leaving the off-chip driver and off-chip receiver disconnected from a load that is off the chip that can degrade accuracy of testing.

* * * * *